(12) United States Patent
Dubon et al.

(10) Patent No.: US 6,938,967 B2
(45) Date of Patent: Sep. 6, 2005

(54) TELESCOPING SLIDE ASSEMBLY

(75) Inventors: William Dubon, Bloomingdale, IL (US); Ronan Stephens, Berwyn, IL (US)

(73) Assignee: Pentair Electronic Packaging Co., Des Plaines, IL (US)

( * ) Notice: Subject to any disclaimer, the term of this patent is extended or adjusted under 35 U.S.C. 154(b) by 0 days.

(21) Appl. No.: 10/318,850

(22) Filed: Dec. 12, 2002

(65) Prior Publication Data

US 2003/0141791 A1 Jul. 31, 2003

Related U.S. Application Data

(60) Provisional application No. 60/340,774, filed on Dec. 12, 2001.

(51) Int. Cl.[7] ............................................. A47B 88/04
(52) U.S. Cl. ................ 312/333; 312/330.1; 312/334.44
(58) Field of Search ............................. 312/330.1, 333, 312/334.1, 334.5, 334.7, 334.8, 334.44, 334.46, 334.47, 350; 211/26, 187, 190; 361/725, 727, 825, 829

(56) References Cited

U.S. PATENT DOCUMENTS

| | | | |
|---|---|---|---|
| 1,708,668 A | 4/1929 | Evans | |
| 1,938,908 A | 12/1933 | Hunter | |
| 2,004,057 A | 6/1935 | Schmitz | |
| 3,123,419 A | 3/1964 | Maxwell | |
| 3,124,401 A | 3/1964 | McClellan | |
| 3,133,768 A | * 5/1964 | Klakovich | 384/17 |
| 3,328,106 A | 6/1967 | Mullin | |
| 3,701,577 A | 10/1972 | Fischer | |
| 3,776,608 A | 12/1973 | Fall et al. | |
| 3,801,166 A | 4/1974 | York | |
| 3,869,184 A | 3/1975 | Lambert et al. | |
| 3,937,531 A | 2/1976 | Hagen et al. | |
| 3,950,040 A | 4/1976 | Fall | |
| 3,995,927 A | 12/1976 | Stein | |
| 4,004,841 A | 1/1977 | Vander Ley | |
| 4,089,568 A | 5/1978 | Fall | |
| 4,101,178 A | 7/1978 | Adams et al. | |
| 4,200,342 A | 4/1980 | Fall | |
| 4,331,369 A | 5/1982 | Lazar et al. | |
| 4,441,772 A | 4/1984 | Fielding et al. | |
| 4,473,262 A | 9/1984 | Staye | |
| 5,419,639 A | 5/1995 | Hobbs | |
| 5,484,197 A | 1/1996 | Hansen et al. | |
| 5,542,759 A | 8/1996 | Krivec | |
| 5,551,775 A | 9/1996 | Parvin | |
| 5,571,256 A | * 11/1996 | Good et al. | 211/26 |
| 5,591,132 A | 1/1997 | Carrie | |
| 5,703,514 A | 12/1997 | Hsu et al. | |
| 5,757,109 A | 5/1998 | Parvin | |
| 5,851,059 A | 12/1998 | Cirocco | |
| 5,871,265 A | 2/1999 | Stewart et al. | |

(Continued)

FOREIGN PATENT DOCUMENTS

EP 585037 * 3/1994

*Primary Examiner*—James O. Hansen
(74) *Attorney, Agent, or Firm*—Vedder, Price, Kaufman & Krumholz

(57) ABSTRACT

A telescoping slide assembly includes interconnected mounting, intermediate and stationary slide elements movable relative to one another to extend and retract the mounting and intermediate slide elements relative to the stationary slide element between fully extended and retracted positions. The intermediate slide element includes a rib formed therein. A mounting slide lock is disposed substantially within the rib for operative engagement with the mounting slide element to secure the mounting slide element in a fully extended position such that selective release of the mounting slide lock permits the mounting slide element to move to the fully retracted position and to disconnect from the intermediate slide element.

27 Claims, 14 Drawing Sheets

U.S. PATENT DOCUMENTS

| | | |
|---|---|---|
| 5,895,101 A | 4/1999 | Cabrales et al. |
| 5,904,412 A | 5/1999 | Lammens |
| 5,961,193 A | 10/1999 | Hobbs |
| 5,974,667 A | 11/1999 | Bryson |
| 5,980,007 A | 11/1999 | Singh |
| 5,988,780 A | 11/1999 | Rock et al. |
| 6,145,944 A | 11/2000 | Bayani et al. |
| 6,145,945 A | 11/2000 | Parvin |
| D437,857 S | 2/2001 | Cooper et al. |
| 6,199,967 B1 | 3/2001 | Bayles et al. |
| 6,209,979 B1 | 4/2001 | Fall et al. |
| 6,224,178 B1 | 5/2001 | Cirocco |
| 6,230,903 B1 * | 5/2001 | Abbott ........................ 211/26 |
| 6,236,563 B1 | 5/2001 | Buican et al. |
| 6,244,178 B1 | 6/2001 | DeMoore et al. |
| 6,254,209 B1 | 7/2001 | Parvin |
| 6,254,210 B1 | 7/2001 | Parvin |
| 6,257,683 B1 | 7/2001 | Yang |
| 6,296,332 B1 | 10/2001 | Lammens |
| 6,588,866 B2 * | 7/2003 | Cheng ..................... 312/334.7 |

* cited by examiner

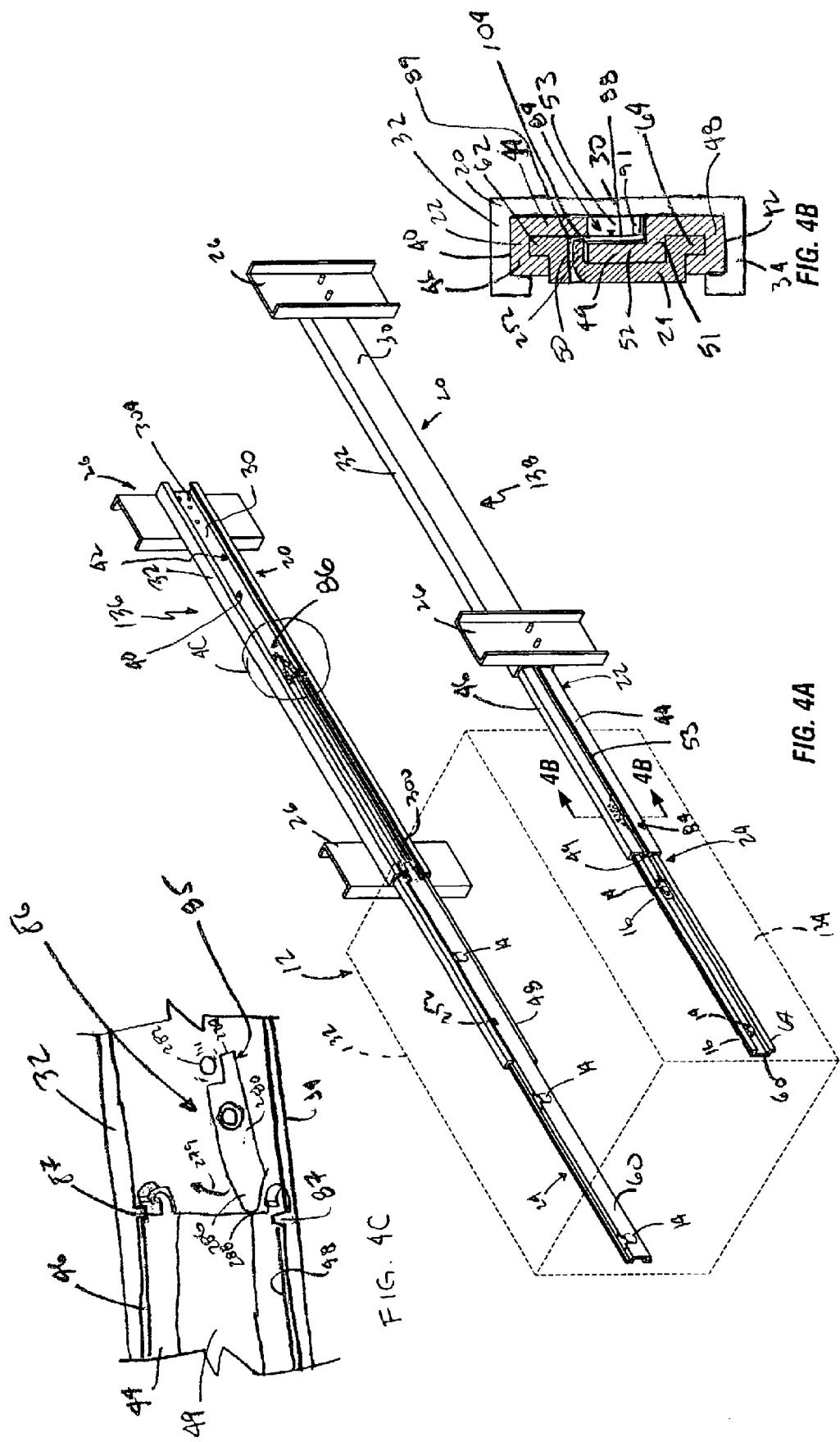

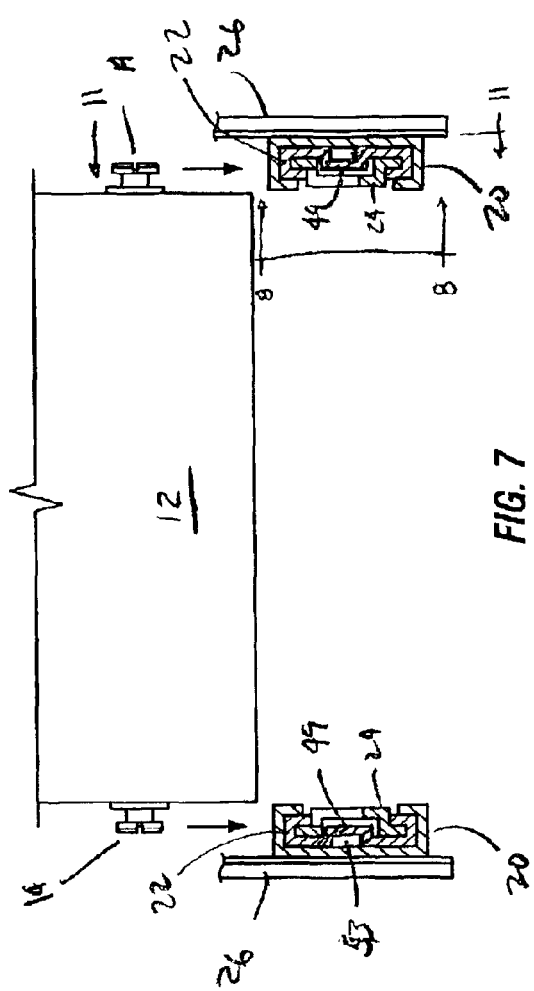
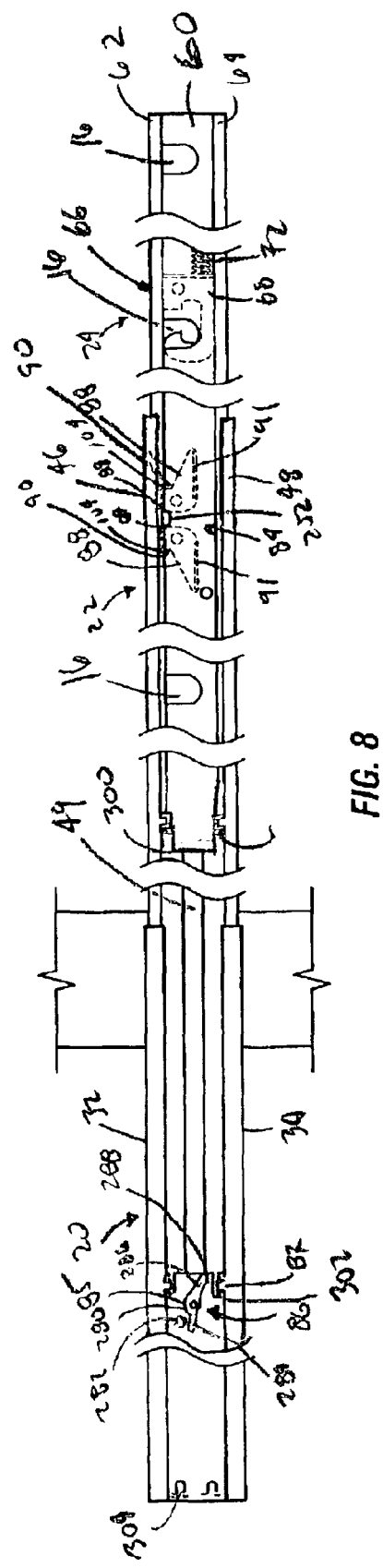
FIG. 7
FIG. 8

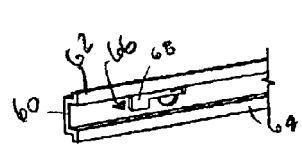
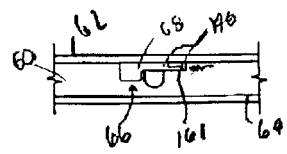
FIG. 17A-1  FIG. 17A-2
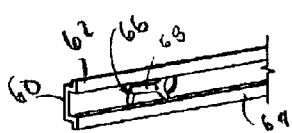
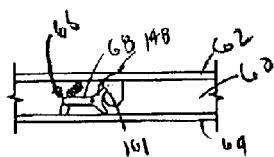
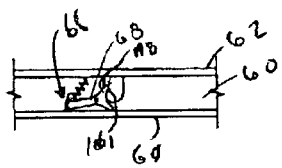
FIG. 17B-1  FIG. 17B-2  FIG. 17B-3
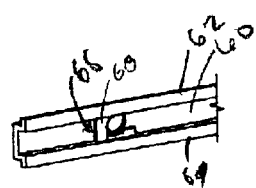
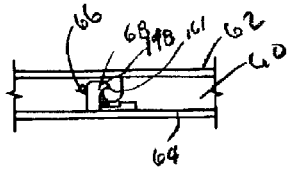
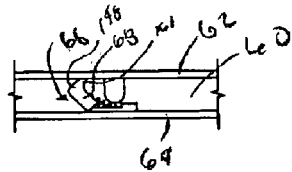
FIG. 17C-1  FIG. 17C-2  FIG. 17C-2
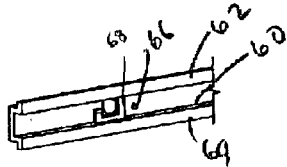
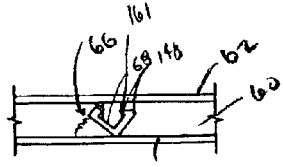
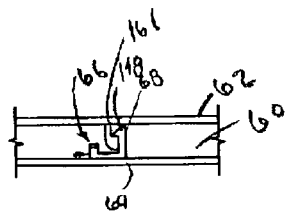
FIG. 17D-1  FIG. 17D-2  FIG. 17D-3

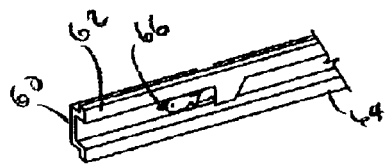 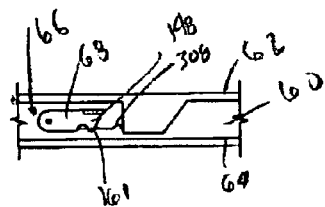
FIG. 20A-1   FIG. 20A-2
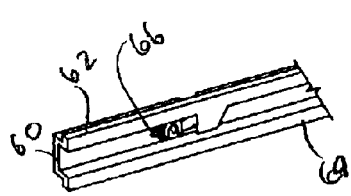 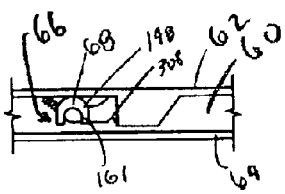 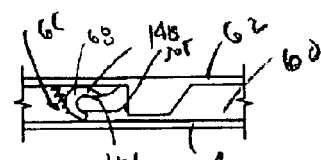
FIG. 20B-1   FIG. 20B-2   FIG. 20B-3
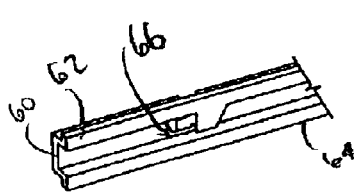 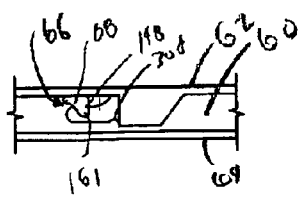
FIG. 20C-1   FIG. 20C-2

US 6,938,967 B2

TELESCOPING SLIDE ASSEMBLY

IMPROVED TELESCOPING SLIDE ASSEMBLY

This application claims priority under 35 U.S.C. §119(e) to U.S. Provisional Application Ser. No. 60/340,774, filed Dec. 12, 2001, which is expressly incorporated by reference herein.

BACKGROUND OF THE INVENTION

The present invention relates to telescoping slide assemblies, and particularly to a slide assembly system having at least two telescoping slide members. More particularly, the present invention relates to a pair of spaced-apart telescoping slide assemblies which are adapted to be releasably coupled to a piece of equipment, known as a chassis, which is positioned to lie therebetween.

Installation of a piece of electronic, console equipment or other hardware unit on a telescoping slide assembly mounted in an enclosure or hardware cabinet is accomplished using various installation tools and perhaps two or more technicians. Other types of equipment are also mounted on telescoping slide assemblies using various connectors and tools.

A chassis (such as a server) usually includes three mounting posts coupled to a left side wall of the chassis and three or more mounting posts coupled to a right side wall of the chassis. Each mounting post includes an anchor coupled to the chassis side wall and a throat sized to move through the slot to reach the installed position.

A pair of telescoping slide assemblies are mounted in a computer hardware cabinet and positioned to lie in side-by-side spaced-apart parallel relation so that the chassis will lie between the mounting slide element in each of the two telescoping slide assemblies. The three mounting posts on the left side wall of the chassis can be moved into three complementary slots formed in the mounting slide element of the left-side telescoping slide member while simultaneously the three mounting posts on the right side wall of the chassis are being moved into three complementary slots formed in the mounting slide element of the right-side telescoping slide assembly.

There are numerous prior art slide rail designs for mounting telecommunications equipment. A major disadvantage of these prior slide rail assemblies is that they have been designed through a trial and error process rather than focus on engineering principles. The prior art designs fail to minimize friction, balance momentum and minimize pull tension. Several different methods have been attempted to overcome the friction of the early prior art design, namely, ball bearings and specialized coatings. Unfortunately, the ball bearing design actually increases the friction between the rails. The coated rails also fail to overcome the high friction design. This is especially apparent after the coatings begin to wear and allow for metal-on-metal contact.

Therefore, there is a need for an improved slide rail assembly that minimizes friction between the sliding rails, balances momentum and minimizes pull tension and which also includes improved locking and insertion designs.

Features of the present invention will become apparent to those skilled in the art upon consideration of the following detailed description of preferred embodiments exemplifying the best mode of carrying out the invention as presently perceived.

BRIEF DESCRIPTION OF THE DRAWINGS

The detailed description particularly refers to the accompanying figures in which:

FIGS. 4A, 5 and 6 show movement of the chassis on the telescoping slide assemblies (from a fully extended position shown in FIG. 4A) toward a retracted position in the cabinet wherein FIG. 5 shows movement of the mounting slide element into the intermediate slide element where the intermediate retraction stop has been moved to a first operative position disposed within the rib; and FIG. 6 shows movement of the mounting and intermediate slide elements (together as a unit) into the stationary slide element fixed to a rack mounted inside the cabinet;

FIG. 4B is a section view taken along line 4B—4B of FIG. 4A illustrating the travel tab disposed within the capture zone;

FIG. 4C is a detailed view of area 4C of FIG. 4A showing an intermediate slide retraction stop of the three-part telescoping slide assembly;

FIG. 7 is a partial front elevation view of the chassis shown in FIG. 2 as it is being lowered into place between the two mounting slide elements of the telescoping slide assemblies;

FIG. 8 is a side elevation view taken along lines 8—8 of FIG. 7 showing one of the telescoping slide assemblies in a fully extended position;

FIG. 11 is an enlarged elevation view taken generally along line 11—11 of FIG. 7 showing the chassis being lowered into position where the mounting posts to be connected to the chassis are above openings into the three post-receiving slots in the mounting slide element;

FIG. 12 is a view similar to FIG. 11 showing movement of the mounting posts to the bottom of the post-receiving slots and movement of one of the mounting posts on a curved contact surface included in the post-locking latch mounted adjacent to one of the post-receiving slots to move the latch along an axis to stretch a spring to allow that mounting post to be moved (as shown in FIG. 13) downwardly into a bottom of the post-receiving slot;

FIG. 13 is a view similar to FIGS. 11 and 12 showing return of the post-locking latch (under a return force applied by the spring acting against the mounting slide element) to a normal slot-closing position to block removal of the mounting post from the post-receiving slot so that the chassis is locked in a fixed position in the mounting slide element (yet releasable therefrom as shown, for example, in FIG. 14);

FIGS. 17A–D are perspective and front elevation views of alternative embodiments of the post-locking latch illustrated in connection with the post-receiving slot of one embodiment of the present invention;

FIGS. 20A–C are perspective and front elevation views of the post-receiving slots of FIGS. 19A–C illustrated in connection with post-locking latches;

DETAILED DESCRIPTION OF THE PREFERRED EMBODIMENTS

Figure 1:
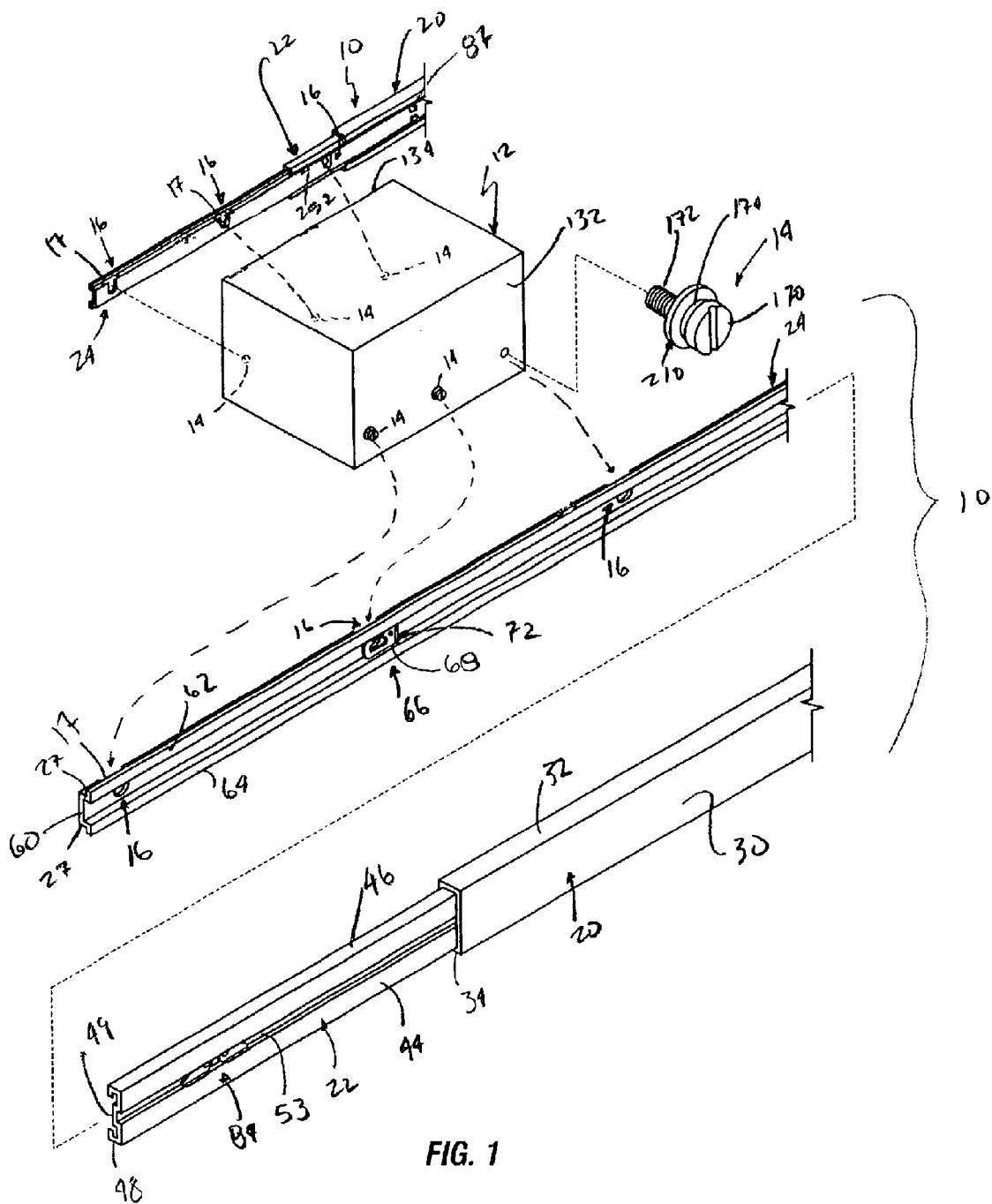
FIG. 1 is a perspective assembly view showing a piece of equipment, outfitted with six mounting posts and showing three post-receiving slots formed in the mounting slide elements of two three-part telescoping slide assemblies and also showing a latch adapted to be mounted on a mounting slide element adjacent to one of the post-receiving slots and a mounting slide lock to orient the mounting slide element in a fully extended position.

In one principal aspect of the present invention, a telescoping slide assembly includes interconnected mounting, intermediate and stationary slide elements movable relative to one another to extend and retract the mounting and intermediate slide elements relative to the stationary slide element between fully extended and retracted positions.

The intermediate slide element includes a rib formed therein. A mounting slide lock is disposed substantially within the rib for operative engagement with the mounting slide element to secure the mounting slide element in a fully extended position such that selective release of the mounting slide lock permits the mounting slide element to move to the fully retracted position and to disconnect from the intermediate slide element.

In another principal aspect of the present invention, a telescoping slide assembly includes interconnected mounting, intermediate and stationary slide elements movable relative to one another to extend and retract the mounting and intermediate slide elements relative to the stationary slide element between fully extended and retracted positions.

The intermediate slide element includes a rib formed therein. The rib has a discontinuous segment defining an opening through the intermediate slide element. A mounting slide lock is disposed on the mounting slide element for operative engagement with the opening on the intermediate slide element in order to orient the mounting slide element in a fully extended position such that selective release of the mounting slide lock permits movement of the mounting slide element to move to the retracted position and to disconnect the mounting slide element from the intermediate slide element.

In yet another principal aspect of the present invention, a telescoping slide assembly includes interconnected mounting, intermediate and stationary slide elements movable relative to one another to extend and retract the mounting and intermediate slide elements relative to the stationary slide element between fully extended and retracted positions.

The intermediate slide element includes a rib formed therein. A mounting slide extension stop is disposed substantially within the rib for operative engagement with the mounting slide element to orient the mounting slide element in a fully extended position such that release of the mounting slide extension stop permits disconnection of the mounting slide element from the intermediate slide element.

In still another principal aspect of the present invention, a telescoping slide assembly includes interconnected mounting, intermediate and stationary slide elements movable relative to one another to extend and retract the mounting and intermediate slide elements relative to the stationary slide element between fully extended and retracted positions.

The intermediate slide element includes a rib formed therein. The intermediate slide element also has an outer end face obliquely disposed with respect to a longitudinal axis of the slide assembly.

In a still further principal aspect of the present invention, a telescoping slide assembly includes interconnected mounting, intermediate and stationary slide elements movable relative to one another to extend and retract the mounting and intermediate slide elements relative to the stationary slide element between fully extended and retracted positions. The stationary slide element is configured substantially C-shaped including a base and offset end walls defining opposed channels.

The intermediate slide element includes opposed guide portions connected by a back having a rib formed therein. The opposed guide portions are configured for nesting relation within the opposed channels and the rib includes a top wall and bottom wall interconnected by a support wall. The rib walls are configured such that an open side is disposed adjacent the stationary slide element. The mounting slide element includes a spine and opposed flanges extending from the spine collinearly aligned and offset parallel to the base, wherein the opposed flanges are configured for nesting relation within the opposed guide portions.

Mounting posts 14 are connected to a chassis 12 and adapted to be connected to mounting slide elements 24 included in a pair of telescoping slide assemblies 10 mounted to lie in spaced-apart parallel relation to one another in a cabinet 18 as shown, for example, in FIGS. 1–3A to permit a user to mount and dismount the chassis 12 quickly and easily. In the illustrated embodiment, cabinet 18 includes a rack of computer equipment, and chassis 12 is sized to be mounted on the telescoping slide assemblies 10 to permit technicians to gain access to the chassis by moving it out of the cabinet 18 on telescoping slide assemblies 10. Installation and replacement of such a chassis is quick and easy because of the way in which mounting posts 12 are released from "locked" positions in slots 16 formed in each of the two mounting slide elements 24 (i.e., mounting slide elements) included in the telescoping slide assemblies 10.

A telescoping slide assembly 10 is arranged to be mounted on a rack to lie in side-by-side parallel relation with another telescoping slide assembly 10 so that a chassis 12 can be carried on the pair of side-by-side telescoping slide assemblies 10 (136, 138) as shown, for example, in FIGS. 3–6. Chassis 12 is outfitted with six mounting posts 14 as shown in FIG. 1. It is within the teaching of the present invention to use more or less than six mounting posts. Each mounting post 14 is sized to be received within a post receiving slot 16 of each assembly 10 in order to connect chassis 12 to telescoping slide assemblies 10.

Figure 9:
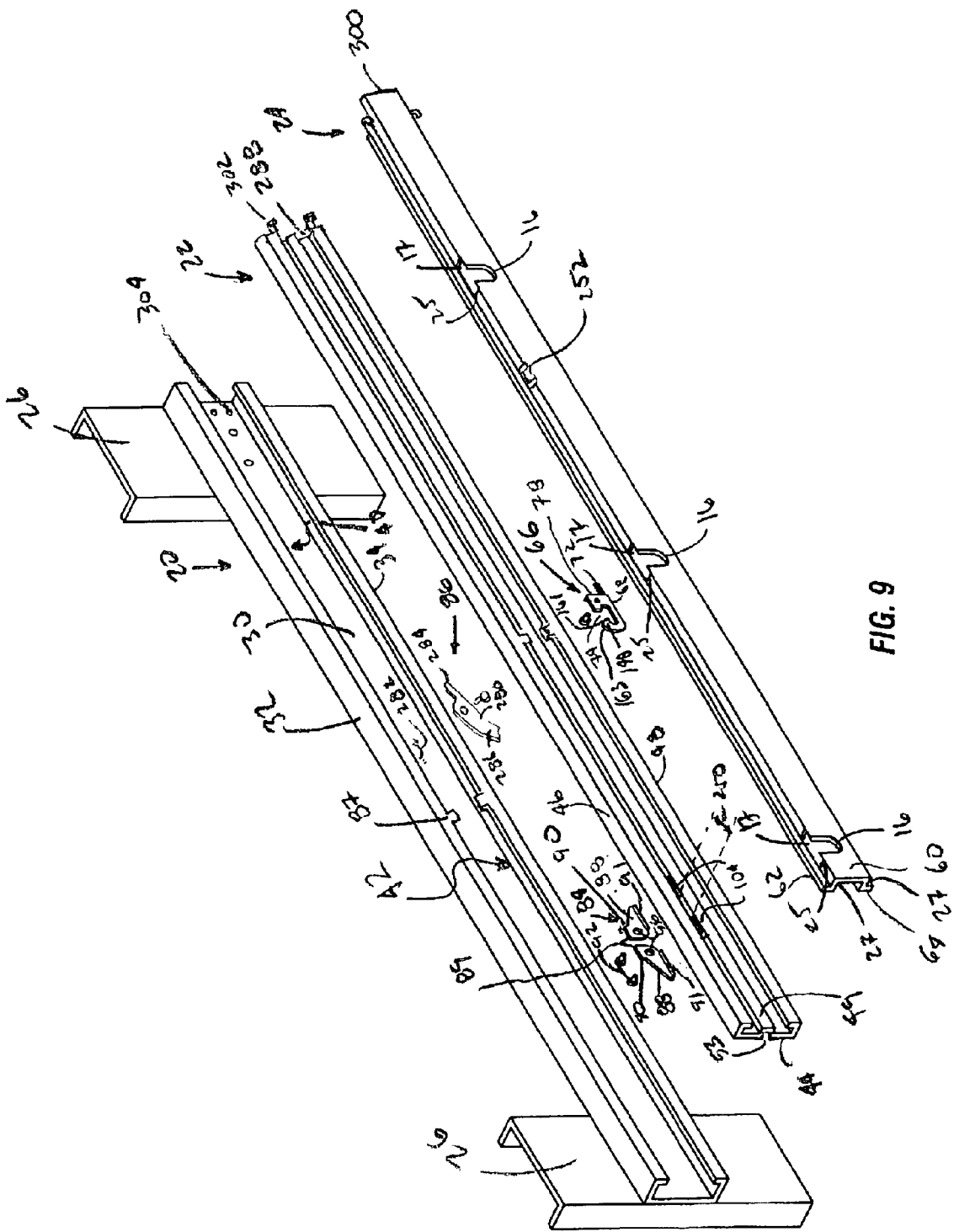
FIG. 9 is a perspective exploded view showing the components of the telescoping slide assembly shown in FIG. 8 prior to assembly.
Figure 10A:
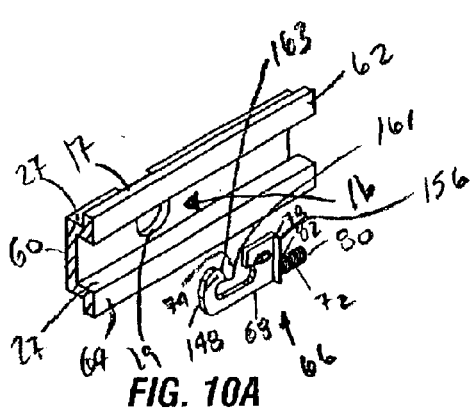
FIG. 10A is a perspective exploded view showing components in the spring-biased, post-locking latch prior to mounting those components onto the wall of the mounting slide element in close proximity to one of the post-receiving slots.
Figure 10B:
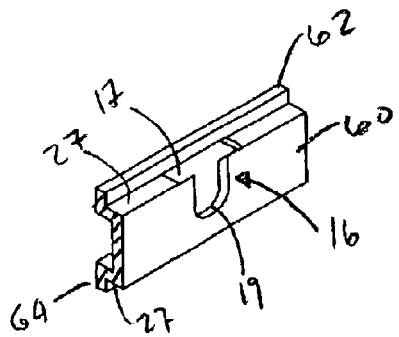
FIG. 10B is a perspective view of the portion of mounting slide element of FIG. 10A (taken from the opposite side—see FIG. 9) showing a spine that includes the post-receiving slot having a wide inlet opening sized to receive the enlarged head of the mounting post, and opposed flanges extending from the spine.

Each slot 16 includes an entry portion 17 and a post-retainer portion 19 as shown best in FIGS. 9, 10A and 10B. The entry portion 17 and the post-retainer portion 19 do not need to be vertically aligned. For example, various alternative slot configurations are within the teachings of the present invention. Some of the alternative configurations are discussed with respect to FIGS. 18 and 19. The entry portion 17 communicates with an opening 25 formed in the spine 60.

Figure 3A:
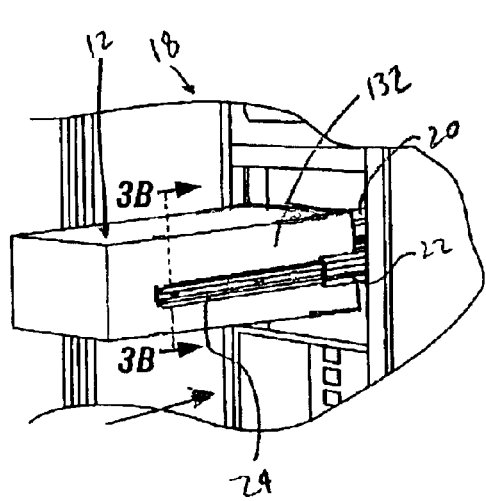
FIG. 3A is a perspective view similar to FIG. 2 showing the chassis mounted on a telescoping slide assemblies as the chassis is pushed inwardly (in the direction of the arrow) into a retracted position for storage within the cabinet.
Figure 3B:
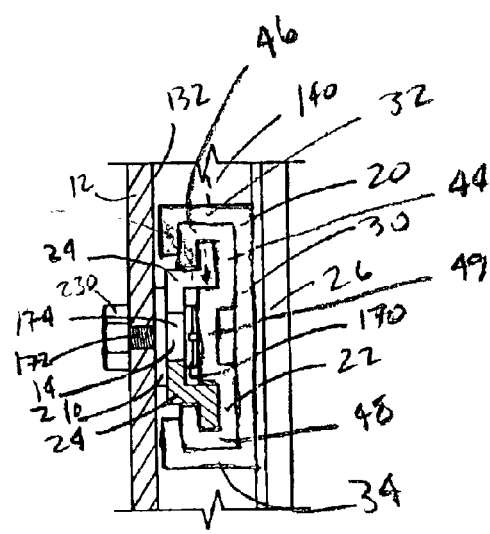
FIG. 3B is a section view taken along line 3B—3B of FIG. 3A showing the position of one of the mounting posts connected to the chassis and received one of the post-receiving slots formed in the mounting slide element of the three-part telescoping slide assembly.

Each mounting post 14 includes a head 170 at one end, fastener 172 at an opposite end, a throat 174 positioned to lie between head 170 and fastener 172, and a flange 210 positioned to lie between fastener 172 and throat 174 as shown, for example, in FIGS. 1 and 3a. In the illustrated embodiment, head 170 may be slotted to accept a screwdriver blade, fastener 172 is threaded to engage a mounting nut 230 shown in FIG. 3B, and flange 210 is an enlarged annular disk coupled to throat 174 and shaped to resemble a washer.

Referring to FIGS. 1–3B, 7, and 10–13, one of skill in the art will recognize how one person may position chassis 12 between two fully extended telescoping slide assemblies 136, 138, lower chassis 12 so that mounting posts 14 drop into slots 16 formed in the mounting slide elements 24 included in each of the telescoping slide assemblies 136, 138 to cause post-locking latches 66 mounted on each of the two mounting slide elements 24 to lock chassis 12 to mounting slide elements 24 included in telescoping slide assemblies 136, 138 without the need to use any tools. Release of mounting posts 14 from their locked positions in slots 16 to permit removal of chassis 12 from a mounted position on slide assemblies 136, 138 is shown, for example, in FIG. 14. Alternative embodiments of the post-locking latch are disclosed in FIGS. 17A-1–D-3 and 20A-1–C-2 and will be discussed in detail hereinafter.

Throat 174 of mounting post 14 is sized to move in slot 16, while head 170 and flange 210 each have a diameter that is greater than the width of the slot 16. Mounting slide element 24 is formed to include a wide opening 25 in a horizontally extending portion 27 of the spine 60 which connects the upper flange 62 and the spine 60 of mounting slide element 24 (see FIGS. 9 and 10b) that is sized to accept head 15 so that mounting post 14 can be moved to pass throat 19 into and through slot 16 formed in spine 60 and head 15 into and through opening 25 formed in a portion 27 of the spine 60.

Each telescoping slide assembly 10 (136, 138) is typically formed to include a stationary slide element 20, an intermediate slide element 22, and a mounting slide element 24, as shown in FIGS. 1 and 9. Each slide assembly 10 is fixed to a cabinet 18 and movable between a fully retracted position and a fully extended position relative to cabinet 18 so that chassis 12 may be stored within cabinet 18 as suggested by FIGS. 3–6. It is within the teachings of this invention to use a telescoping slide assembly having two or more slide members.

Stationary slide 20 is fixed within cabinet 18 by brackets 26. It is within the teachings of this invention to include any type of bracket to couple stationary slide 20 to cabinet 18. For example, a bracket may be connected to the telescoping slide assembly for mounting within the cabinet. Stationary slide 20 may be connected to brackets 26 by any suitable connectors 28, shown in FIG. 9. For example, the connectors may be screws, bolts, two-part fasteners, hook and loop fasteners, rivets, adhesive on other suitable connector. Stationary slide 20 is formed to include a base 30, a top end wall 32, and a bottom end wall 34. An upper channel 40 is defined by the top end wall connector 32 and the base 30, and a lower channel 42 is defined by the bottom end wall 34 and the base 30.

Intermediate slide 22 is similarly formed to include a back 44, a top guide portion 46, and a bottom guide portion 48 each connected to the base 44, generally bisected by a rib 49. The top guide portion 46 is configured to receive an upper edge of mounting slide element 24. A bottom guide portion 48 is configured to receive a lower edge of mounting slide 24.

The rib 49 includes a top wall 50 and a bottom wall 51 interconnected by a support wall 52 such that the rib walls 50, 51 and 52 are configured so that an open slide 53 is disposed adjacent the stationary slide element 20.

Intermediate slide 22 is received within stationary slide 20 in a nesting relationship, as shown in FIG. 1, so that base 30 of stationary slide 20 is positioned to lie adjacent to back 44 of intermediate slide 22. Intermediate slide 22 is also movable relative to stationary slide 20.

It will be recognized by those of skill in the art that it is within the teachings of this invention to include any type of bearing or a wear pad made of any suitable material in order to provide a low coefficient of friction between intermediate slide 22 and stationary slide 20.

Mounting slide 24 includes a spine 60, a horizontally extending portion 27 connected to spine 60, an upper flange 62 connected to horizontal portion 27, a horizontally extending portion 27 connected to spine 60 and a lower flange 64 also connected to horizontal portion 27, as shown in FIGS. 1, 9, and 10. Mounting slide 24 is connected to and received within intermediate slide 22 such that upper flange 62 is received within upper guide portion 54 of intermediate slide 22 and lower flange 64 is received within lower guide portion 56 of intermediate slide 22, both in generally nesting relationships.

It is within the teachings of the present invention that rollers may be provided between the intermediate mounting slide elements. The rollers act as bearings so that there is a low coefficient of friction making mounting slide element freely movable relative to intermediate slide element. The mounting slide 24 is further formed to define post-receiving slots 16, as mentioned above, in spine 60, as shown, for example, in FIG. 10b. Slots 16 are formed to receive mounting posts 14 as shown in FIGS. 1 and 11–13.

In one embodiment of this invention, each telescoping slide assembly 10 may further include a post-locking latch 66 as best shown in FIGS. 1, 9, and 10–14. Post-locking latch 66 is connected to spine 60 of the mounting slide element 24 and generally includes a lock body 68 and a spring 72. As shown in FIG. 10, lock body 68 including a slot 74 formed therein and spine 60 include a projection formed therein for cooperative association to control movement of the lock body 68. Lock body 68 is positioned to lie adjacent to spine 60 and spring 72 is disposed to engage the lock body 68 adjacent a rear face 78 of lock body 68. A first end 80 of spring 72 is coupled to spine 60 of mounting slide 24. Preferably, the first end 80 is received within an aperture (not shown) of spine 60. A second end 82 of spring 72 is connected to lock body 68 by being passed through an aperture (not shown) formed in lock body 68.

Lock body 68 includes a tip portion 148 at one end and, a handle 156 at another end. Tip portion 148 serves as a "gate" that is able to move longitudinally relative to the mounting slide 24 to control entry of a mounting post 14 into (and exit of the mounting post 14 from) the post-receiving slot 16 associated with lock body 68, as shown in FIGS. 11–14, and, in the illustrated embodiment, the gate established by lock body 68 is spring-loaded and moves linearly along the mounting slide 24.

Tip portion 148 includes a post blocker 161 and a contact surface 163 as shown in FIGS. 1 and 10. Post blocker 161 is arranged to block exit of mounting post 14 from post-receiving slot 16 when chassis 12 is mounted on mounting slide element 24 and lock body 68 is moved to its slot-closing position as shown, for example, in FIG. 13. Mounting post 14 acts to move the spring-biased lock body 68 (temporarily) to a slot-opening position as shown, for example, in FIG. 12 during mounting of chassis 12 on mounting slide element 24 upon engagement of head 15 of the downwardly moving mounting post 14 on the curved contact surface 163 provided on tip portion 148 to permit entry of mounting post 14 (past post-locking latch 66) into the post-retainer portion 146 of post-receiving slot 16.

Figure 5:
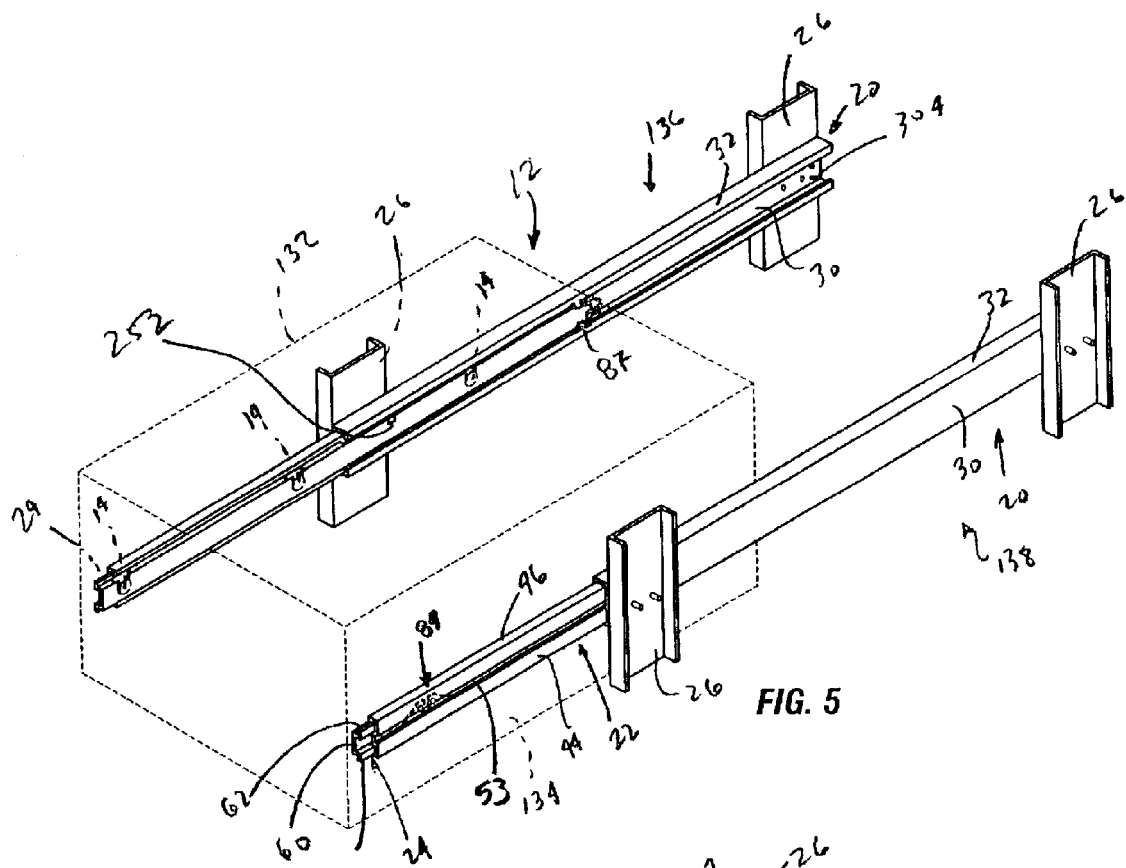

As shown in FIG. 9, in this embodiment of the present invention, each telescoping slide assembly 10 further includes a mounting slide lock 84 and an intermediate slide lock 86. Mounting slide lock 84 is configured to lock mounting slide element 24 to intermediate slide 22 (as shown in FIGS. 8 and 11–14) to prevent mounting slide element 24 from retracting back within intermediate slide 22 when telescoping slide assembly 10 is in the fully extended position, as shown, for example, in FIGS. 8 and 1. Intermediate slide lock 86 is provided for locking intermediate slide 22 to stationary slide 20 when intermediate slide 22 reaches its fully extended position as shown in FIGS. 4, 5, and 8. The intermediate slide lock 86 includes an intermediate retraction stop 85 and an intermediate extension stop 87 which cooperate to maintain the intermediate slide 22 in the fully extended position.

Mounting slide element lock 84 in this embodiment is coupled to mounting slide element 24 and includes a pair of latch arms 88 disposed in spaced opposition each having a ramp portion 90, a stop portion 89, a lift portion 91 and a pin 92. Each latch arm 88 connected to the rib 49 formed in the back 44 of the intermediate slide element 22 such that the latch arms 88 are disposed substantially within the rib 49. Pin 92 is received within an aperture 96 of latch arm 88 and an aperture (not shown) of intermediate slide element 22 such that the lifting portion 91 rests on a bottom wall 51 of the rib 49. A pair of apertures 104 are provided in the top wall 50 of the rib 49 normally to receive the ramp and stop portions 90, 89 therethrough as shown in FIG. 8.

A capture zone 250 is defined by those portions of the ramp portions 90 and stop portions 89 which extend through the top wall 50 of the rib 49. A travel tab 252 disposed on the mounting slide element 24 operatively associates with the capture zone 250 to secure the mounting slide element 24 in a fully extended position, as shown in FIG. 8.

Figure 6:
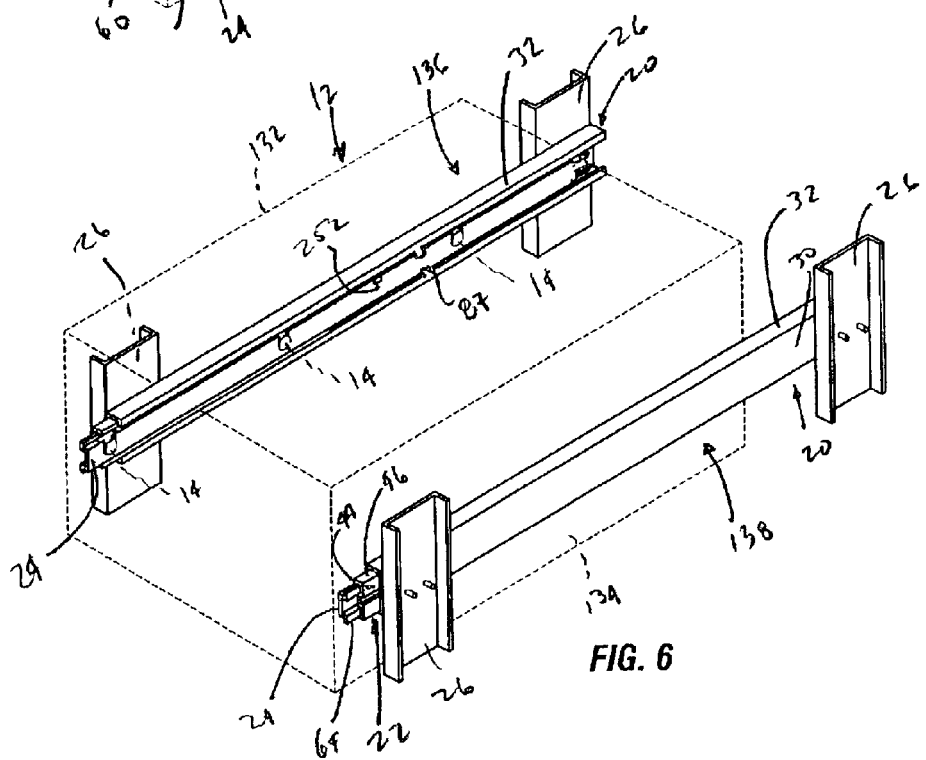

Selective release of the mounting slide lock 84 permits the mounting slide element 24 to move to the fully retracted position. FIG. 6 and to disconnect from the intermediate slide element 22. The latch arm 88 may be moved either as a result of contact with the travel tab 252 or as a result of the lift portion 91 movement.

When the mounting slide element 24 is installed into the intermediate slide element 22, retraction movement of the mounting slide 24 causes the travel tab 252 to contact and move over the ramp portion 90 of the outer latch arm 88 into the capture zone 250. This orientation is the fully extended position.

Likewise, extended the mounting slide element 24 from a retracted position to the fully extended position causes the travel tab 252 to contact and move over the ramp portion 90 of the inner latch arm 88 into the capture zone 250. The stop portions 89 of each latch arm 88 effectively define the extent of the capture zone 250.

When the travel tab 252 is disposed in the capture zone 250 the mounting slide element 24 cannot be moved from the fully extended position without releasing the mounting slide lock 84. Contact between the travel tab 252, the stop portions 89 causes the latch arm 88 to attempt to rotate in the direction of intended travel. However, the pin 92 connects the latch arm 88 to the rib 49 such that contact forces the lift portion 91 into the bottom wall 51 of the rib inhibiting movement of the mounting slide element 24.

In order to move the mounting slide element 24 from the fully extended position, the lift portion 91 of the selected latch arm 88 must be moved to release the mounting slide lock 84. As a result, the travel tab 252 may be moved in the direction of the selected latch arm 88 without contact with the stop portion.

Figure 15A:
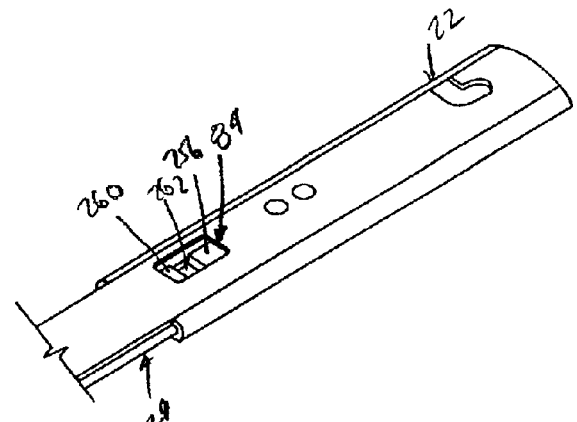
FIG. 15A is a partial view of the three-part telescoping slide assembly illustrating an alternative embodiment of the mounting slide lock.
Figure 15B:
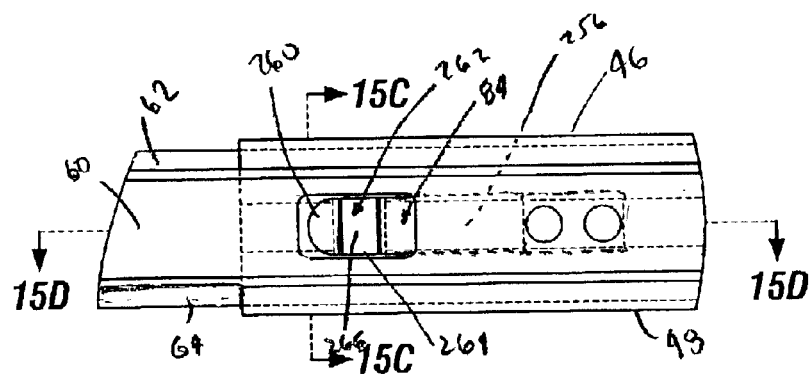
FIG. 15B is a partial front elevation view of the telescoping slide assembly of FIG. 15A, illustrating the latch arm of the mounting slide lock engaging an opening in the intermediate slide element.
Figure 15C:
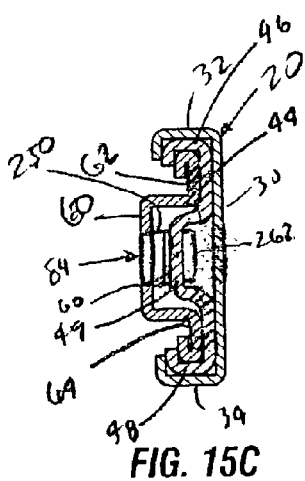
FIG. 15C is a section view of the telescoping slide assembly taken along line 15C—15C of FIG. 15B.
Figure 15D:
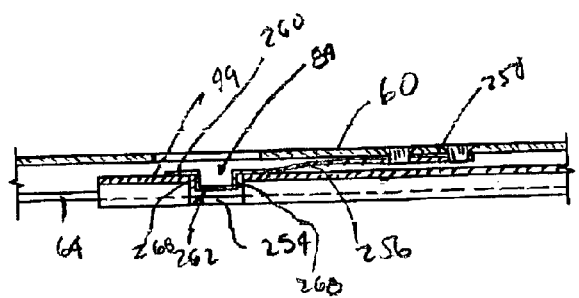
FIG. 15D is a section view of the telescoping slide assembly taken along line 15D—15D of FIG. 15B.

In another embodiment of the present invention, a mounting slide lock 84 is disposed on the mounting slide element 24 for operative engagement with an opening 254 formed in the intermediate slide element 22 as a discontinuous element thereof. See FIGS. 15A–B. While the principal of this embodiment is the same as discussed above, the structure and function are different and will be explained below. The mounting slide lock 84 includes a latch arm 256 having a first end 258 connected to the mounting slide element 24 and a free end 260 extended away from the mounting slide element 24 in the general direction of the intermediate slide element 22. Preferably, the latch arm 256 is formed from a resilient material such as steel or plastic. However, it will be recognized by those of skill in the art that any other suitable material may be used.

A projection 262 is formed adjacent the free end 260 of the latch arm 256 for operative engagement with the opening 254. In this embodiment, the projection 262 is configured as a channel 264 having a bottom 266 disposed generally parallel to and offset from the latch arm 254 and a pair of side walls 268 connecting the bottom 266 to the latch arm 254. Preferably, the opening 254 is configured complementary to the projection 262 such that there is a tight interface.

The free end 260 of the latch arm 254 is movable from a first operative position where the projection contacts the intermediate slide element 72 during movement of the mounting slide element 24 relative to the intermediate slide element 72 and a second operative position where the projection 262 extends into the opening 254.

When the projection 262 engages the opening 254 the mounting slide element is locked into the fully extended position. In order to move the mounting slide element 24 relative to the intermediate slide element 22 the mounting slide lock must be released. Moving the latch arm 254 from the second operative position to the first operative position releases the mounting slide lock 84.

Figure 21:
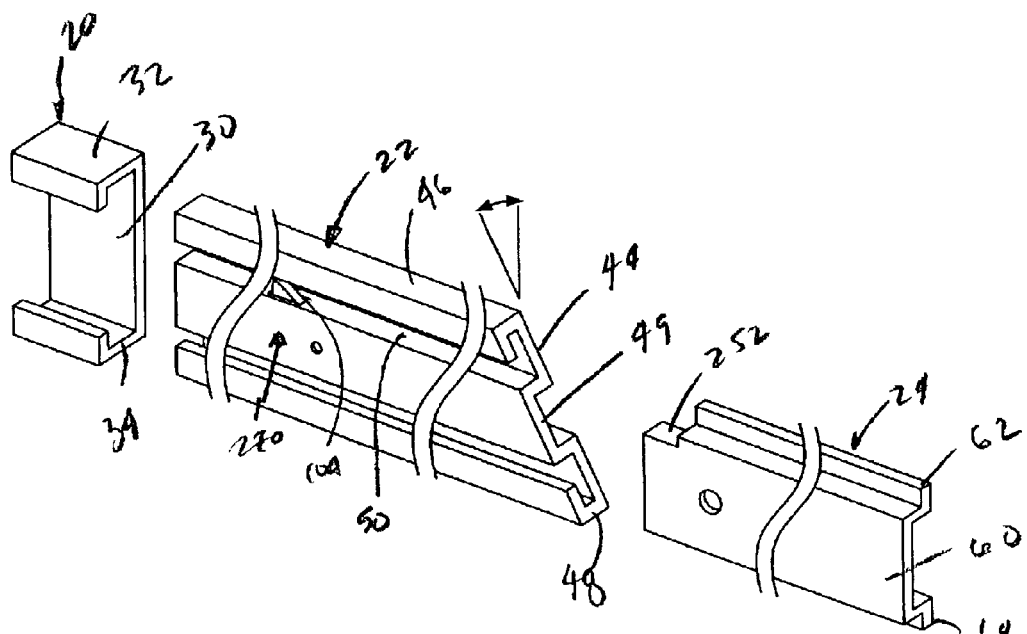
FIG. 21 is an exploded partially broken away perspective view of an alternative embodiment of the three-part telescoping slide assembly illustrating an outer end face of the intermediate slide element obliquely disposed with respect to the longitudinal axis of the telescoping slide assembly.
Figure 22:
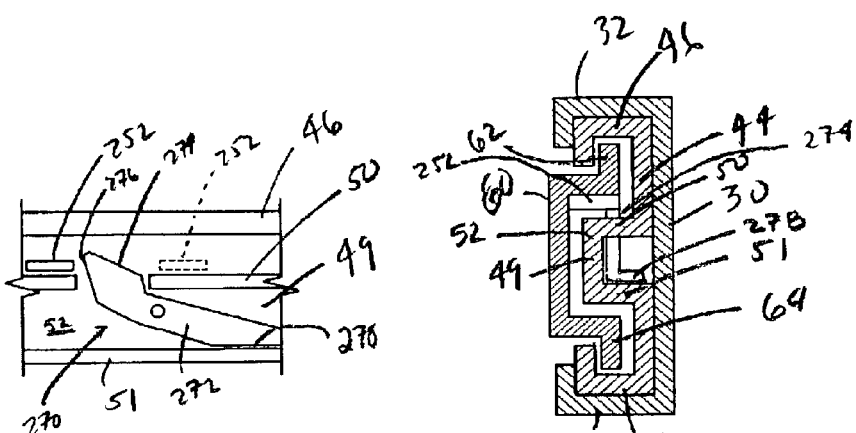
FIG. 22 is a detailed view of the telescoping slide assembly of FIG. 21 illustrating movement of the mounting slide element travel tab with respect to the mounting slide extension stop.
Figure 23:
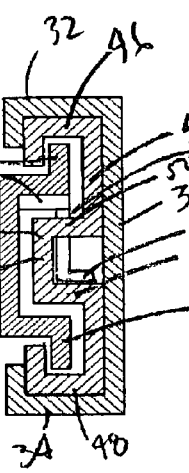
FIG. 23 is a section view of the telescoping slide assembly of FIG. 21 when assembled.

In yet another embodiment of the present invention, a mounting slide extension stop 270 is disposed substantially within the rib 49 for operative engagement with a travel tab 252 to orient the mounting slide element 24 in a fully extended position, see FIGS. 21–23. Again, this embodiment is similar to and effectively operates as one half of the mounting slide lock 84 first described above.

A latch arm 272 is movably connected to the rib 49 and includes a ramp portion 274, a stop portion 276 and a lift portion 278. The ramp portion 274 and lift portion 278 are each available to move the latch arm 272 to enable movement of the mounting slide element 24 relative to the intermediate slide element 22.

The ramp portion 274 and stop portion 276 extend through a slot 104 in the top wall 50 of the rib for operative engagement with the travel tab 252. When the travel tab 252 contacts and moves over the ramp portion 274 during installation the latch arm moves so that the mounting slide element 24 may be further moved in the direction of the fully retracted position, see FIG. 22.

During servicing, the mounting slide element 24 is moved from the retracted position in the direction of the fully extended position. The travel tab 252 moves along the top wall 50 of the rib 49 until contact with the stop portion 276 of the mounting slide extension stop 270. As discussed above, the lift portion 278 prohibits the mounting slide element 24 from moving past the fully extended position with release thereof. Moving the lift portion 278 releases the mounting slide extension stop 270 such that the mounting slide element 24 may be moved relative to the intermediate slide element 22 in the direction of the latch arm 272 without the travel tab 252 contacting the stop portion 276 of the latch arm 272.

The intermediate slide lock 86 is disposed on the stationary slide element 20 and includes an intermediate retraction stop 85 and an intermediate extension stop 87 as best shown in FIGS. 4C, 8 and 9. The intermediate retraction stop 85 includes an arm 280 and a drop stop 282 such that the arm 280 is movable between a first operative position (when moved in direction of arrow 279) where the arm 280 is oriented to be received and disposed with the rib 49 when the intermediate slide element 22 is disposed in the position other than the fully extended position and a second operative position, see FIG. 4C, where a tab 284 is formed on the arm 280 for contacting the stop 282 so that a first end 286 of the arm 180 is disposed to engage in inner end 288 of the intermediate slide element 22. Thereby, preventing retraction of the intermediate slide element 22 until the arm 280 is moved to the first operative position.

Figure 16A:
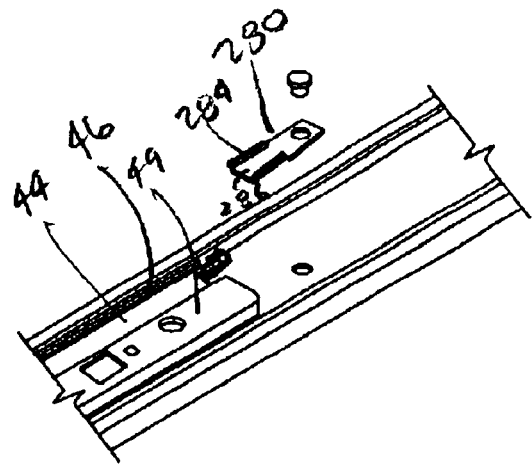
FIG. 16A is a partial exploded perspective view of the three-part telescoping slide assembly illustrating an alternative embodiment of the intermediate retraction stop of the intermediate slide lock.
Figure 16B:
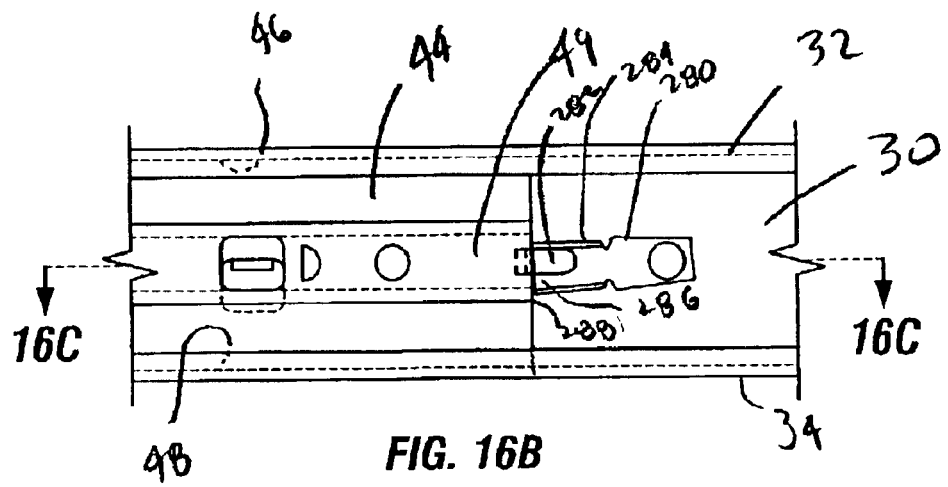
FIG. 16B is a partial front elevation view of the telescoping slide assembly of FIG. 16A illustrating an arm and drop stop of the intermediate retraction stop.
Figure 16C:
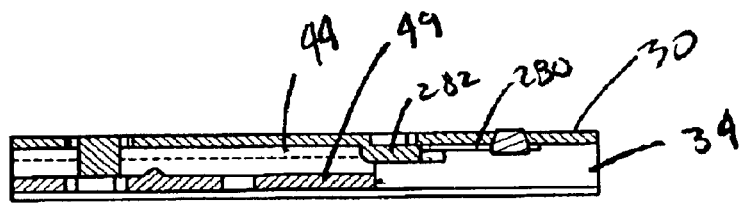
FIG. 16C is a sectional view of the telescoping slide assembly taken long line 16C—16C of FIG. 16B.
Figure 18A:
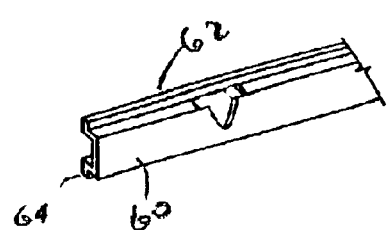
FIGS. 18A–E partial detail are perspective views of alternative embodiments of post-receiving slots formed in the mounting slide element having openings oriented to the top of the mounting slide element.
Figure 18B:
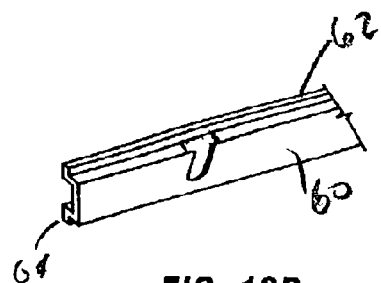
Figure 18C:
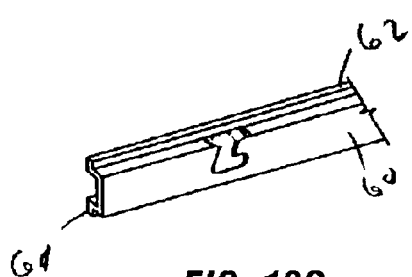
Figure 18D:
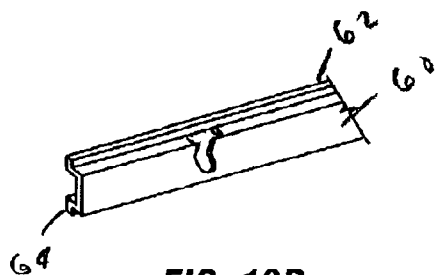
Figure 18E:
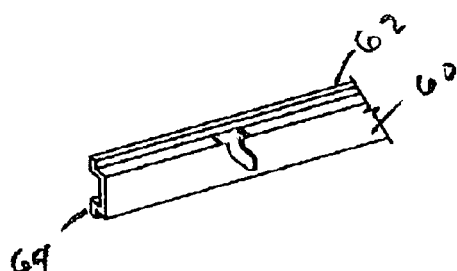

In one embodiment of the present invention, the drop stop 282 and the tab 284 are disposed adjacent the first end 286, see FIGS. 16A–C. In another embodiment of the present invention, the drop stop 282 and the tab 284 are disposed opposite the first end 286, see FIGS. 4C and 8.

An intermediate retraction stop release 300 is disposed on the mounting slide element 24 for contact with the arm 280 of the intermediate retraction stop 86. When the mounting slide element 24 is moved from the fully extended position to the fully retracted position, the intermediate retraction stop release 300 contacts and moves the arm 280 from the second operative position to the first operative position in direction of arrow 279.

Intermediate travel tabs 302 disposed on the intermediate slide element 22 engage the intermediate extension stop 87 formed on the stationary slide element 20 in order to prevent removal of the intermediate slide element 22 from the stationary slide element 20. A stationary retraction stop 304 may also be disposed on the stationary slide element 20 to orient the intermediate and mounting slide element 22, 24 the fully retracted position.

Figure 2:
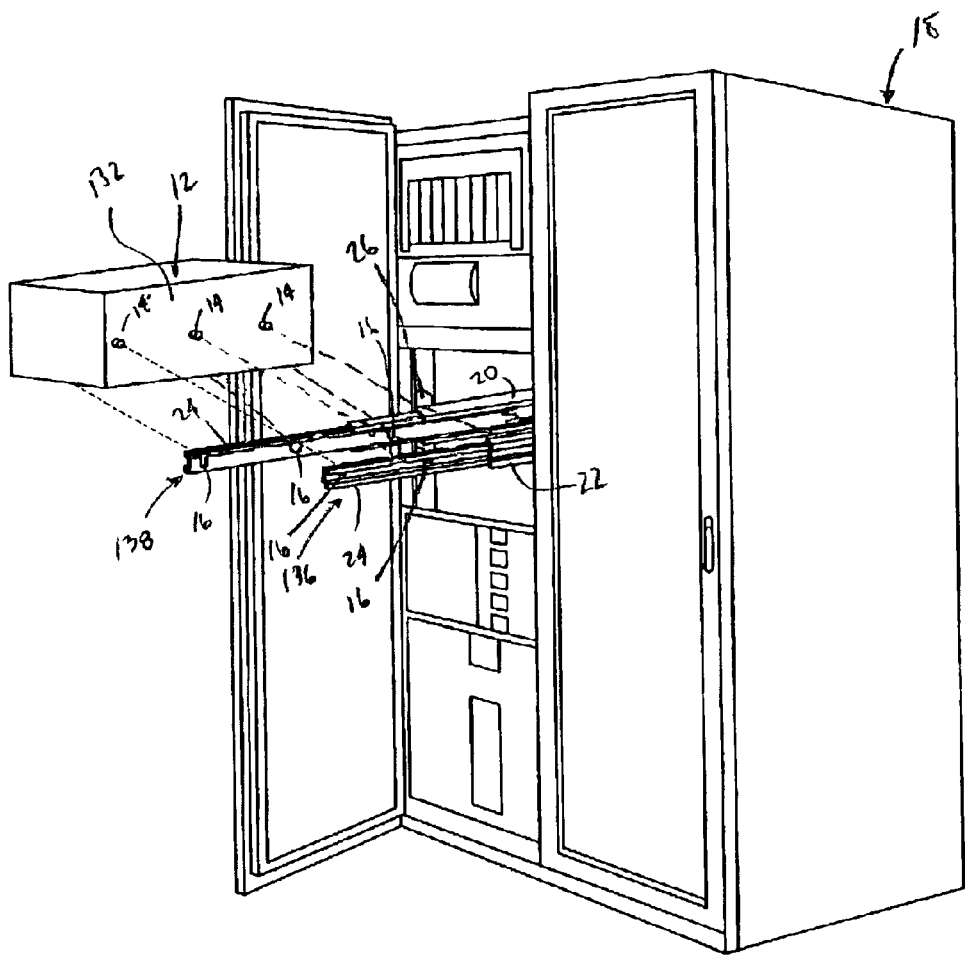
FIG. 2 is a perspective view of the chassis (e.g., a server) shown in FIG. 1 before the chassis is mounted onto two fully extended telescoping slide assemblies fixed in a cabinet.

As mentioned before, the slides 22 and 24 in each telescoping slide assembly 10 are movable between a fully retracted position, wherein intermediate slide section 22 is received fully within stationary slide 20 and mounting slide element 24 is received fully within intermediate slide 22, and a fully extended position, shown in FIG. 2, wherein each slide 20, 22, 24 is extended fully with respect to one another. Preferably, as the slides in slide assembly 10 move from the fully retracted position to the fully extended position, mounting slide element 24 remains positioned fully within intermediate slide 22 and does not move relative to intermediate slide 22. In this embodiment, only intermediate slide 22 (with mounting slide element 24) initially moves relative to stationary slide 20. It will be recognized by those of skill in the art that other sequencing methods may be used. For example, the mounting slide 84 may fully extend before the intermediate slide extends from the stationary slide 20.

Preferably, once intermediate slide 22 has moved to its fully extended position relative to stationary slide 20, the intermediate travel tab 302 in the intermediate slide element 22 engage the intermediate extension stop 87 and the first end 286 of the arm 280 falls by gravity out of the rib 49 to engage the inner end 288 of the intermediate slide element 22. Intermediate slide lock 86, thus prevents intermediate slide 22 from moving relative to stationary slide 20. Mounting slide element 24 may now be moved relative to intermediate slide 22 toward the fully extended position. As mounting slide element 24 moves to its fully extended position relative to intermediate slide 22, travel tab 252 contacts and moves over ramp portion 90 of latch arm 88 into the capture zone 250. Mounting slide element 24 is thus prevented from moving relative to intermediate slide 22.

In order to retract intermediate slide element 22 into stationary slide 20, lift portion 91 of the inner latch arm 88 must be moved such that the stop portion 89 does not impede movement of the mounting slide element 24. Thereby, allowing mounting slide element 24 to move relative to intermediate slide 22. Once mounting slide element 24 moves to a fully retracted position within intermediate slide 22, an intermediate retraction stop release 300 contacts the arm 280 to move the arm 280 upwardly to the first operative position. Thereby, the intermediate retraction stop 15 is released to allow intermediate slide 22 (and the mounting slide element 24 therein) to move relative to stationary slide 20 toward the fully retracted position in stationary slide 20.

In order to mount chassis 12 to telescoping slide assemblies 10, three mounting posts 14 are coupled to a right side 132 of chassis 12 and three mounting posts 14 are coupled to a left side 134 of chassis 12. Mounting posts 14 are shown to be shoulder screws; however, it is within the teachings of this invention to include any type of post mounted to right and left sides 132, 134 of chassis 12. Posts 14 coupled to right side 132 of chassis 12 are provided to correspond with a right-side telescoping slide assembly 136 (of a cooperating pair of telescoping slide assemblies 10 coupled to cabinet 18) and posts 14 coupled to left side 134 of chassis 12 are provided to correspond with a left-side telescoping slide assembly 138, as shown in FIGS. 1, 2, and 4–7.

Figure 11:
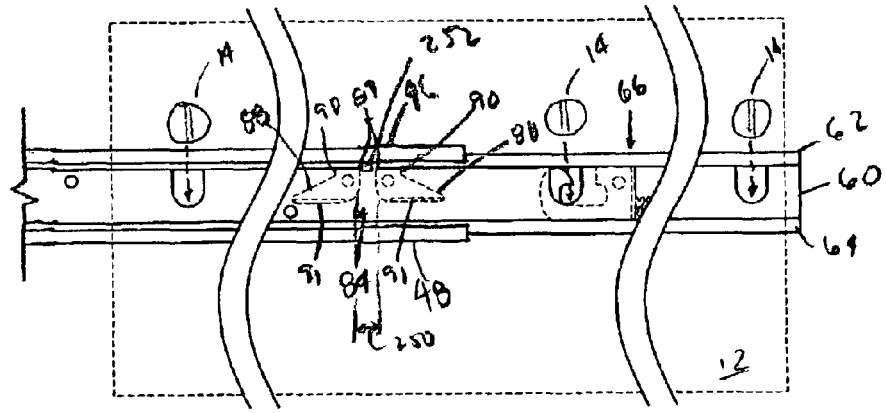
FIGS. 11–13 show a sequence in which the mounting posts are lowered and locked into the slots formed in one of the mounting slide elements.

As shown in FIG. 2, stationary slide 20 of each telescoping slide assembly 136, 138 is coupled to cabinet 18 by brackets 26 which are shown diagrammatically in FIG. 4. When telescoping slide assemblies 136, 138 are in the fully extended position, all three post-receiving slots 16 of each mounting slide element 24 are exposed so that chassis 12 may be lowered between each of the right-side and left-side telescoping slide assemblies 136, 138. Each mounting post 14 is thus received within a corresponding post-receiving slot 16. FIGS. 7 and 11, for example, show chassis 12 being lowered in a downward direction 140 in order for posts 14 to be received within companion slots 16 formed in mounting slide elements 24.

Figure 12:
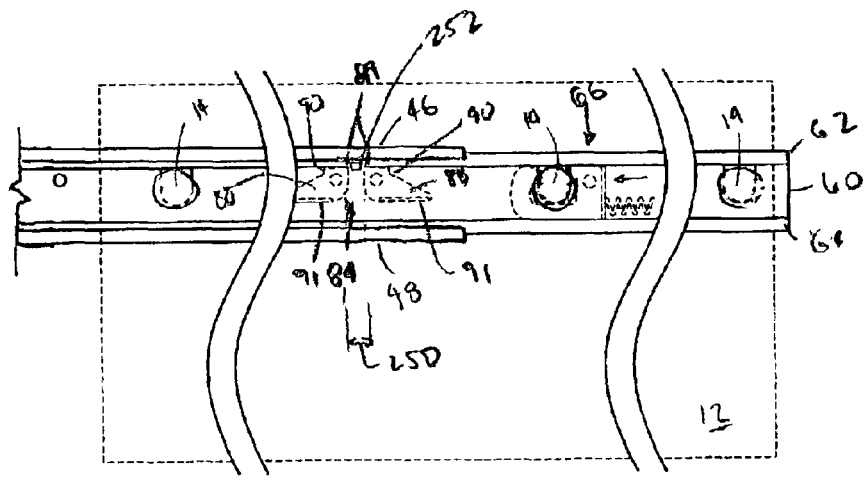
Figure 13:
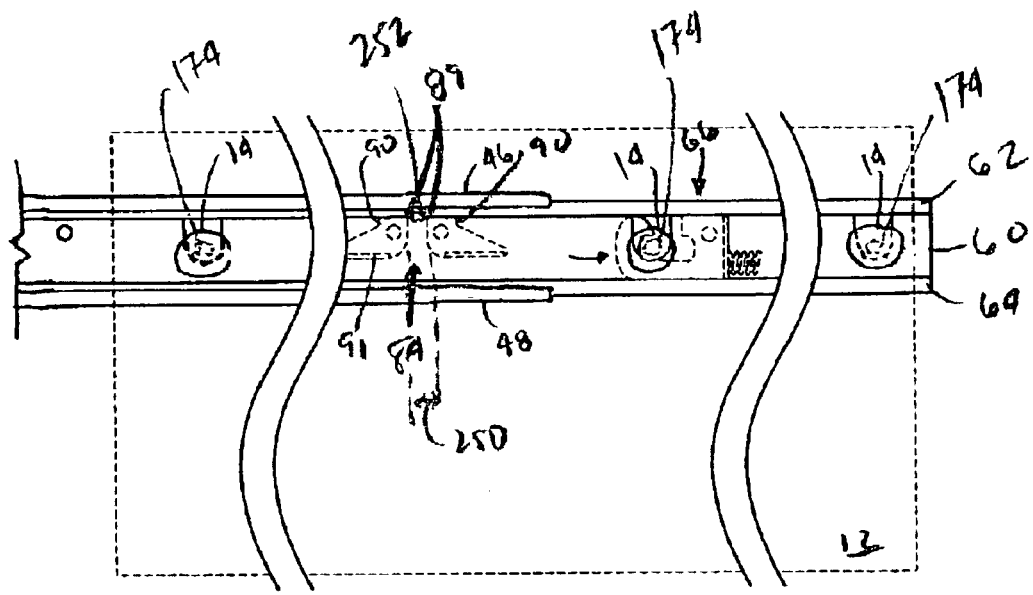

As chassis 12 is lowered between right and left telescoping slide assemblies 136, 138 and each mounting post 14 is being received within each corresponding post-receiving slot 16, as shown in FIG. 11, a middle mounting post 14 is urged to engage the lock body 68 of post-locking latch 66. The downward force of mounting post 14 causes lock body 68 to move linearly so that mounting post 14 is positioned to rest at the bottom or post-receiving portion of the slot 16, as shown in FIG. 12. Once mounting post 14 is positioned to rest at the bottom portion of post-receiving slot 16, lock body 68 is normally biased so that a post blocker 161 of tip portion 148 of lock body 68 is positioned to lie adjacent to mounting post 14 and prevent mounting post 14 from exiting from post-receiving slot 16. Once chassis 12 is mounted on each telescoping slide assembly 10, chassis 12, and the slides 22, 24 in and slide assemblies 136, 138 may be moved in direction 150 toward the fully retracted position within cabinet 18, as shown in FIGS. 3 and 4–6.

Figure 14:
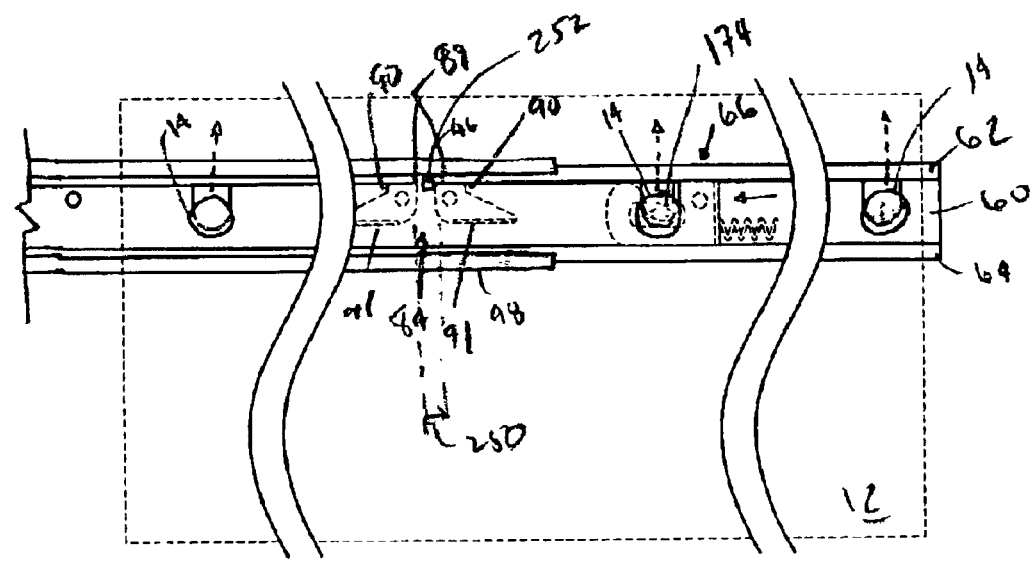
FIG. 14 shows movement of one of the post-locking latches to a slot-opening position to permit removal of the chassis from a mounted position on the mounting slide element of the telescoping slide assembly.

In order to release chassis 12 from telescoping slide assemblies 136, 138, post-locking latch 66 is released by a user, as shown in FIG. 14. User pulls generally forwardly in direction 154 on a back end 156 of lock body 68 against the bias of spring 72 in order to move post blocker 161 of tip portion 148 away from mounting post 14 and "open" the post-receiving slot 16. User may then move chassis 12 up as shown by arrows 157 so that mounting post 14 is moved from the bottom portion of post-receiving slot 16 and out of post-receiving slot 16 through the vertically extending entry portion of slot 16.

FIGS. 17A–1, 17D–3 illustrate alternative post-locking latches 66. The lock body 68 in each figure is connected to the mounting slide element 24 adjacent the post-receiving slot 16. Each lock body 68 is movable so that the mounting post may move past the tip portion 148 of the lock body 68 and then be moved back to an original position such that the post-blocker 161 prevents mounting post 14 from exiting from post-receiving slot 16.

FIGS. 18A–E illustrate alternative embodiments of post-engaging slots operative with any embodiment of the present invention.

Figure 19A:
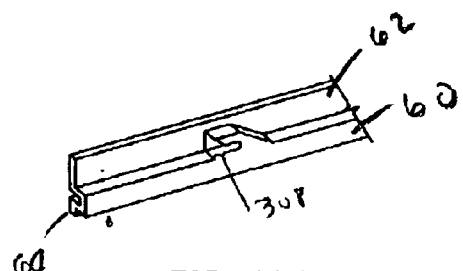
FIGS. 19A–C are perspective views of further alternative embodiments of post-receiving slots formed in the mounting slide element having an opening disposed in line with the longitudinal axis of the telescoping slide assembly.
Figure 19B:
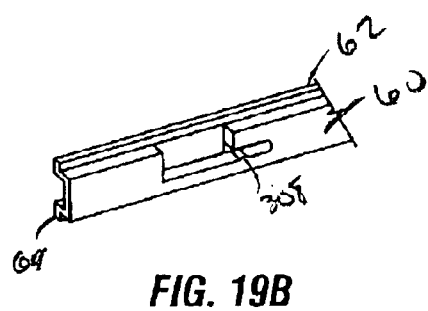
Figure 19C:
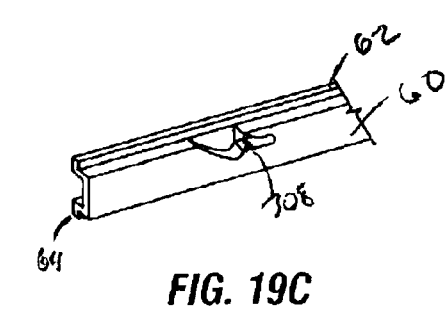

FIGS. 19A–C illustrate alternative embodiments of post-engaging slots which have an initial opening oriented along the longitudinal axis of the telescoping slide assemblies. It will be noted that in each such post-receiving slot of this embodiment, there is a protrusion which defines a tortured path for preventing unintended removal of the mounting post. This protrusion 308 operates as a mechanical lock which has no moving parts. Thereby, cost and complexity can be reduced.

FIGS. 20A-1–C-2 illustrate alternative embodiments of post-receiving slots having openings along the longitudinal axis of the telescoping slide assemblies which are operative with mechanical locks as shown. Generally, a protrusion also defines a tortured path in the post-receiving slot in these embodiments. The mechanical lock element includes a lock body which further secures the mounting post within the post-receiving slot.

Although the invention has been described in detail with reference to certain preferred embodiments, variations and modifications exist within the scope and spirit of the invention as described and defined in the following claims.

What is claimed is:

1. A telescoping slide assembly comprising:
   interconnected mounting, intermediate and stationary slide elements movable relative to one another to extend and retract the mounting and intermediate slide elements relative to the stationary slide element between fully extended and retracted positions;
   the intermediate slide element including a rib formed therein; and
   a mounting slide lock incvluding a pair of latch arms disposed substantially within the rib for operative engagement with the mounting slide element to secure the mounting slide element in a fully extended position such that selective release of the mounting slide lock permits the mounting slide element to move to the fully retracted position and to disconnect from the intermediate slide element.

2. The telescopic slide assembly as recited in claim 1, wherein the mounting slide element includes at least one slot formed therin adapted to engage a mounting post connected to a piece of equipment to be caried by the mounting slide element.

3. The telescopic slide assembly as recited in claim 2, wherein each at least one slot includes an opening oriented towards a top of the mounting slide element.

4. The telescopic slide assembly as recited in claim 2, wherein the mounting slide element includes at least one latch connected thereto for movement between a first operative position where the latch blocks removal of the mounting post from the slot after insertion and a second operative position where the latch permits insertion and removal of the mounting post with respect to the slot.

5. The telescopic slide assembly as recited in claim 4, wherein the latch is normally biased to the first operative position.

6. The telescopic slide assembly as recited in claim 1, wherein an intermediate retraction stop is disposed on the stationary slide element.

7. The telescopic slide assembly as recited in claim 6, wherein an intermediate retraction stop release is disposed on the mounting slide element for contact with an arm of the intermediate retraction stop when the mounting slide element is moved to the fully retracted position such that the intermediate retraction stop release moves the arm to a first operative position so that the arm is oriented to be received and disposed within the rib in order to enable retraction of the intermediate slide element from a second operative position preventing retraction of the intermediate slide element.

8. A telescoping slide assembly comprising:
interconnected mounting, intermediate and stationary slide elements movable relative to one another to extend and retract the mounting and intermediate slide elements relative to the stationary slide element between fully extended and retracted positions;
the intermediate slide element including a rib formed therein; and
a mounting slide lock disposed substantially within the rib for operative engagement with the mounting slide element to secure the mounting slide element in a fully extended position such that selective release of the mounting slide lock permits the mounting slide element to move to the fully retracted position and to disconnect from the intermediate slide element, wherein an intermediate retraction stop is disposed on the stationary slide element; and the intermediate retraction stop includes an arm and a drop stop where the arm is movable between a first operative position where the arm is oriented to be received and disposed within the rib when the intermediate slide element is disposed in a position other than the fully extended position and a second operative position where a tab formed on the arm contacts the drop stop so that a first end of the arm is disposed to engage an inner end of the intermediate slide element preventing retraction of the intermediate slide element until the arm is moved to the first operative position.

9. A telescoping slide assembly comprising:
interconnected mounting, intermediate and stationary slide elements movable relative to one another to extend and retract the mounting and intermediate slide elements relative to the stationary slide element between fully extended and retracted positions;
the intermediate slide element including a rib formed therein; and
a mounting slide lock disposed substantially within the rib for operative engagement with the mounting slide element to secure the mounting slide element in a fully extended position such that selective release of the mounting slide lock permits the mounting slide element to move to the fully retracted position and to disconnect from the intermediate slide element, wherein the mounting slide lock includes a pair of latch arms disposed in spaced opposition and each including a ramp portion, a stop portion and a lift portion, where the ramp portion and lift portion each move the respective latch arm to enable movement of the mounting slide element from the fully extended position relative to the intermediate slide element.

10. The telescopic slide assembly as recited in claim 9, wherein the ramp portions and stop portions extend through a top wall of the rib to define a capture zone for operative association with a travel tab disposed on the mounting slide element such that when the travel tab contacts and moves over either ramp portion, the respective latch arm moves so that further movement of the mounting slide element results in contact between the travel tab and the stop portion of the opposing latch arm whereby the travel tab is disposed within the capture zone and the mounting slide element is disposed in the fully extended position.

11. The telescopic slide assembly as recited in claim 10, wherein moving the lift portion of either latch arm releases the mounting slide lock such that the mounting slide element may by moved relative to the intermediate slide element in the direction of the selected latch arm.

12. A telescoping slide assembly comprising:
interconnected mounting, intermediate and stationary slide elements movable relative to one another to extend and retract the mounting and intermediate slide elements relative to the stationary slide element between fully extended and retracted positions;
the intermediate slide element including a rib formed therein;
the rib having a discontinuous segment defining an opening through the intermediate slide element;
a mounting slide lock disposed on the mounting slide element for operative engagement with the opening on the intermediate slide element to orient the mounting slide clement in a fully extended position such that release of the mounting slide lock permits movement of the mounting slide element to the retracted position and to disconnect the mounting slide element from the intermediate slide element wherein an intermediate retraction stop is disposed on the stationary slide element and includes an arm and a drop stop where the arm is movable between a first operative position where the arm is oriented to be received and disposed within the rib when the intermediate slide element is disposed in a position other than the fully extended position and a second operative position where a tab formed on the arm contacts the drop stop so that a first end of the arm is disposed to engage an inner end of the intermediate slide element preventing retraction of the intermediate slide element until the arm is moved to the first operative position.

13. The telescopic slide assembly as recited in claim 12, wherein the mounting slide element includes at least one slot formed therein adapted to engage a mounting post connected to a piece of equipment to be carried by the mounting slide element.

14. The telescopic slide assembly as recited in claim 13, wherein each at least one slot includes an opening oriented towards a top of the mounting slide element.

15. The telescopic slide assembly as recited in claim 13, wherein the mounting slide element includes at least one latch connected thereto for movement between a first operative position where the latch blocks removal of the mounting post from the slot after insertion and a second operative position where the latch permits insertion and removal of the mounting post with respect to the slot.

16. The telescopic slide assembly as recited in claim 15, wherein the latch is normally biased to the first operative position.

17. The telescopic slide assembly as recited in claim 12 wherein an intermediate retraction stop release is disposed on the mounting slide element for contact with an arm of the intermediate retraction stop when the mounting slide element is moved to the fully retracted position such that the intermediate retraction stop release moves the arm to a first operative position so that the arm is oriented to be received and disposed within the rib in order to enable retraction of the intermediate slide element from a second operative position preventing retraction of the intermediate slide element.

18. A telescoping slide assembly comprising:
interconnected mounting, intermediate and stationary slide elements movable relative to one another to extend and retract the mounting and intermediate slide elements relative to the stationary slide element between fully extended and retracted positions;
the intermediate slide element including a rib formed therein; and
a mounting slide extension stop disposed substantially within the rib for operative engagement with the mounting slide element to orient the mounting slide element in a fully extended position such that release of the mounting slide extension stop permits disconnection of the mounting slide element from the intermediate slide element, wherein an intermediate retraction stop is disposed on the stationary slide element and the intermediate retraction stop includes an arm and a drop stop where the arm is movable between a first operative position where the arm is oriented to be received and disposed within the rib when the intermediate slide element is disposed in a position other than the fully extended position and a second operative position where a tab formed on the arm contacts the drop stop so that a first end of the arm is disposed to engage an inner end of the intermediate slide element preventing retraction of the intermediate slide element until the arm is moved to the first operative position.

19. The telescopic slide assembly as recited in claim 18, wherein an intermediate retraction stop release is disposed on the mounting slide element for contact with an arm of the intermediate retraction stop when the mounting slide element is disposed in the fully retracted position such that the intermediate retraction stop release moves the arm to a first operative position so that the arm is oriented to be received and disposed within the rib in order to enable retraction of the intermediate slide element from a second operative position preventing retraction of the intermediate slide element.

20. A telescoping slide assembly comprising:
interconnected mounting, intermediate and stationary slide elements movable relative to one another to extend and retract the mounting and intermediate slide elements relative to the stationary slide element between fully extended and retracted positions;
the intermediate slide element including a rib formed therein; and
a mounting slide extension stop disposed substantially within the rib for operative engagement with the mounting slide element to orient the mounting slide element in a fully extended position such that release of the mounting slide extension stop permits disconnection of the mounting slide element from the intermediate slide element, wherein the mounting slide extension stop includes a latch arm movably connected to the rib; the latch arm includes a ramp portion, a stop portion and a lift portion, where the ramp portion and lift portion each move the latch arm to enable movement of the mounting slide element relative to the intermediate slide element and the ramp portion and stop portion extend through a top wall of the rib for operative engagement with a travel tab disposed on the mounting slide element such that when the travel tab contacts and moves over the ramp portion, the latch arm moves so that the mounting slide element may be further moved in the direction of the fully retracted position.

21. The telescopic slide assembly as recited in claim 20, wherein moving the lift portion of the latch arm releases the mounting slide extension stop such that the mounting slide element may be moved relative to the intermediate slide element in the direction of the latch arm without the travel tab contacting the stop potion of the latch arm.

22. A telescoping slide assembly comprising:
interconnected mounting, intermediate and stationary slide elements movable relative to one another to extend and retract the mounting and intermediate slide elements relative to the stationary slide element between fully extended and retracted positions;
the stationary slide element configured substantially C-shaped including a base and offset end walls defining opposed channels;
the intermediate slide element including opposed guide portions connected by a back having a rib formed therein; the opposed guide portions configured for nesting relation within the opposed channels and the rib including a top wall and bottom wall interconnected by a support wall, the rib walls configured such that an open side is disposed adjacent the stationary slide element; and
the mounting slide element including a spine and opposed flanges extending from the spine collinearly aligned and offset parallel to the base, wherein the opposed flanges are configured for nesting relation within the opposed guide portions wherein the rib has a discontinuous segment defining an opening through the intermediate slide element and a mounting slide lock is disposed on the mounting slide element for operative engagement with the opening on the intermediate slide element to orient the mounting slide element in a fully extended position such that release of the mounting slide lock permits movement of the mounting slide element to the retracted position and to disconnect the mounting slide clement from the intermediate slide element.

23. The telescopic slide assembly as recited in claim 22, wherein the mounting slide element includes at least one slot formed therein adapted to engage a mounting post connected to a piece of equipment to be carried by the mounting slide element.

24. The telescopic slide assembly as recited in claim 23, wherein each at least one slot includes an opening oriented towards a top of the mounting slide element.

25. The telescopic slide assembly as recited in claim 23, wherein the mounting slide element includes at least one latch connected thereto for movement between a first operative position where the latch blocks removal of the mounting post from the slot after insertion and a second operative position where the latch permits insertion and removal of the mounting post with respect to the slot.

26. The telescopic slide assembly as recited in claim 25, wherein the latch is normally biased to the first operative position.

27. The telescopic slide assembly as recited in claim 22, wherein a mounting slide extension stop is disposed within the rib for operative engagement with the mounting slide element to orient the mounting slide element in a fully extended position such that release of the mounting slide extension stop permits disconnection of the mounting slide element from the intermediate slide element.

* * * * *